(12) United States Patent
Zhang

(10) Patent No.: US 7,687,825 B2
(45) Date of Patent: Mar. 30, 2010

(54) INSULATED GATE BIPOLAR CONDUCTION TRANSISTORS (IBCTS) AND RELATED METHODS OF FABRICATION

(75) Inventor: Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 172 days.

(21) Appl. No.: 11/857,037

(22) Filed: Sep. 18, 2007

(65) Prior Publication Data
US 2009/0072242 A1    Mar. 19, 2009

(51) Int. Cl.
*H01L 29/739* (2006.01)
*H01L 21/331* (2006.01)
*H01L 29/24* (2006.01)

(52) U.S. Cl. .................... 257/134; 257/77; 257/135; 257/504; 257/E29.104; 257/E29.198; 438/133; 438/138; 438/197; 438/186; 438/341

(58) Field of Classification Search .................. 257/77, 257/135, 133, E29.104, E29.198, E21.383, 257/584, E29.174, E21.35, 316, 287, 504, 257/E27.148, E29.265, E21.421; 438/133–139, 438/197, 268, 201, 186, 341
See application file for complete search history.

(56) References Cited

U.S. PATENT DOCUMENTS

| 4,644,637 | A | 2/1987 | Temple |
| 5,032,888 | A | 7/1991 | Seki |
| 5,468,654 | A | 11/1995 | Harada |
| 5,831,288 | A | 11/1998 | Singh et al. |
| 6,121,633 | A | 9/2000 | Singh |
| 6,475,889 | B1 | 11/2002 | Ring |
| 6,515,303 | B2 | 2/2003 | Ring |
| 6,649,497 | B2 | 11/2003 | Ring |
| 6,946,739 | B2 | 9/2005 | Ring |
| 6,956,238 | B2 | 10/2005 | Ryu et al. |

(Continued)

FOREIGN PATENT DOCUMENTS

DE    39 42 640 A1    8/1990

(Continued)

OTHER PUBLICATIONS

Baliga. "Power MOSFET" *Power Semiconductor Devices.* PWS Publishing Company, Boston, MA. 335-425 (1996).

(Continued)

*Primary Examiner*—Victor A Mandala
*Assistant Examiner*—Whitney Moore
(74) *Attorney, Agent, or Firm*—Myers Bigel Sibley & Sajovec

(57) ABSTRACT

Insulated gate bipolar conduction transistors (IBCTs) are provided. The IBCT includes a drift layer having a first conductivity type. An emitter well region is provided in the drift layer and has a second conductivity type opposite the first conductivity type. A well region is provided in the drift layer and has the second conductivity type. The well region is spaced apart from the emitter well region. A space between the emitter well region and the well region defines a JFET region of the IBCT. An emitter region is provided in the well region and has the first conductivity type and a buried channel layer is provided on the emitter well region, the well region and the JFET region and has the first conductivity type. Related methods of fabrication are also provided.

28 Claims, 6 Drawing Sheets

U.S. PATENT DOCUMENTS

| | | |
|---|---|---|
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 2004/0256659 A1 | 12/2004 | Kim et al. |
| 2005/0104072 A1 | 5/2005 | Slater, Jr. et al. |
| 2005/0151138 A1 | 7/2005 | Slater, Jr. et al. |
| 2006/0261347 A1 | 11/2006 | Ryu et al. |
| 2007/0066039 A1 | 3/2007 | Agarwal et al. |
| 2008/0105949 A1* | 5/2008 | Zhang et al. ............ 257/584 |

FOREIGN PATENT DOCUMENTS

| | | |
|---|---|---|
| EP | 0 865 085 A1 | 9/1998 |
| EP | 1 693 896 A1 | 8/2006 |

OTHER PUBLICATIONS

Baliga. "Insulated Gate Bipolar Transistor" *Power Semiconductor Devices*. PWS Publishing Company, Boston, MA. 426-502 (1996).

Bhatnagar et al. "Comparison of 6H-SiC, and Si for Power Devices" *IEEE Transactions on Electron Devices* 40(3):645-655 (1993).

Streetman. "Bipolar Junction Transistors" *Solid State Electronic Devices*. Prentice Hall, Englewood Cliffs, NJ. 228-284 (1980).

U.S. Appl. No. 11/711,383, filed Feb. 27, 2007, Zhang.

U.S. Appl. No. 11/740,687, filed Apr. 26, 2007, Das et al.

International Search Report, PCT/US2008/008574, Sep. 26, 2008.

* cited by examiner

INSULATED GATE BIPOLAR CONDUCTION TRANSISTORS (IBCTS) AND RELATED METHODS OF FABRICATION

STATEMENT OF GOVERNMENT INTEREST

This invention was made with Government support under Contract No. N00014-05-C-0202 awarded by ONR/DARPA. The Government may have certain rights in this invention.

FIELD OF THE INVENTION

This invention relates to power semiconductor devices and related methods of fabricating power semiconductor devices and, more particularly, to high power bipolar transistors and related methods of fabricating high power bipolar transistors.

BACKGROUND OF THE INVENTION

Power devices made with silicon carbide (SiC) are expected to show great advantages as compared to those on silicon for high speed, high power and/or high temperature applications due to the high critical field and wide band gap of SiC. For devices capable of blocking high voltages, such as voltages in excess of about 5 kV, it may be desirable to have bipolar operation to reduce the drift layer resistance via conductivity modulation resulting from injected minority carriers. However, one technical challenge for bipolar devices in silicon carbide is forward voltage degradation over time, possibly due to the presence of Basal Plane Dislocations (BPD) in single crystals of silicon carbide. Thus, unipolar devices such as SiC Schottky diodes and MOSFETs are typically used for high power applications.

SiC DMOSFET devices with a 10 kV blocking capability have been fabricated with a specific on-resistance of about 100 mΩ×cm². DMOSFET devices may exhibit very fast switching speed of, for example, less than 100 ns, due to their majority carrier nature. However, as the desired blocking voltage of devices increases, for example up to 15 kV or more, the on-resistance of a MOSFET device may increase substantially, due to the corresponding increase in the drift layer thickness. This problem may be exacerbated at high temperatures due to bulk mobility reduction, which may result in excessive power dissipation.

With the progress of SiC crystal material growth, several approaches have been developed to mitigate BPD related problems. See, e.g., B. Hull, M. Das, J. Sumakeris, J. Richmond, and S. Krishinaswami, "Drift-Free 10-kV, 20-A 4H—SiC PiN Diodes", Journal of Electrical Materials, Vol. 34, No. 4, 2005. These developments may enhance the development and/or potential applications of SiC bipolar devices such as thyristors, GTOs, etc. Even though thyristors and/or GTOs may offer low forward voltage drops, they may require bulky commutating circuits for the gate drive and protections. Accordingly, it may be desirable for a SiC bipolar device to have gate turn-off capability.

SiC devices may provide specific on-resistances two orders of magnitude lower than that of conventional silicon devices. Due to their superior on-state characteristics, reasonable switching speed, and/or excellent safe-operation-area (SOA), 4H—SiC insulated gate bipolar transistors (IGBTs) are becoming more suitable for power switching applications. SiC IGBTs are discussed in, for example, U.S. Pat. No. 5,831,288 and U.S. Pat. No. 6,121,633, the disclosures of which are incorporated herein as if set forth in their entirety.

However, due to the nature of bipolar devices, SiC IGBTs may lack current saturation capability and may have a higher activation percentage at high temperatures for p-type dopants in SiC. A high p-type activation percentage may cause lower JFET effect between n-wells for p-channel IGBTs or a higher minority injection efficiency from p-type collector for n-channel IGBTs. Both of these conditions may result in a negative temperature coefficient of on-resistance.

Due to low carrier lifetimes on SiC, the majority carriers modulation in the emitter side may be low, which may result in a high forward voltage for IGBTs.

SUMMARY OF THE INVENTION

Some embodiments of the invention provide an insulated gate bipolar conduction transistor (IBCT). The IBCT includes a drift layer having a first conductivity type. An emitter well region is provided in the drift layer and has a second conductivity type opposite the first conductivity type. A well region is provided in the drift layer and has the second conductivity type. The well region is spaced apart from the emitter well region. A space between the emitter well region and the well region defines a JFET region of the IBCT. An emitter region is provided in the well region and has the first conductivity type and a buried channel layer is provided on the emitter well region, the well region and the JFET region and has the second conductivity type.

In further embodiments of the present invention, the buried channel layer may include an epitaxial layer. The buried channel layer may have a thickness of from about 1000 to about 3000 Å and a doping concentration of from about $5 \times 10^{15}$ to about $1 \times 10^{17}$ cm$^{-3}$.

In still further embodiments of the present invention, a substrate may be provided and the substrate may be an off-axis n-type silicon carbide substrate and the drift layer and the buried channel layer may be p-type silicon carbide epitaxial layers.

In some embodiments of the present invention, the drift layer may have a doping concentration of from about $2 \times 10^{14}$ cm$^{-3}$ to about $6 \times 10^{14}$ cm$^{-3}$ and a thickness of from about 100 μm to about 120 μm for greater than 10 kV applications.

In further embodiments of the present invention, the IBCT may have a blocking voltage of about 8.0 kV and a leakage current of less than about 0.1 mA/cm².

In still further embodiments of the present invention, the IBCT may have a differential on-resistance of 50 mΩ·cm² at a gate bias of −16V at 25° C.

In some embodiments of the present invention, the first conductivity type may be n-type and the second conductivity type may be p-type. In certain embodiments, the first conductivity type may be p-type and the second conductivity type may be n-type.

In further embodiments of the present invention, a buffer layer may be provided between a substrate and the drift layer, wherein the buffer layer has the first conductivity type.

Still further embodiments of the present invention provide IBCTs including a bipolar junction transistor (BJT) portion and an insulated gate bipolar transistor (IGBT) portion.

Some embodiments of the present invention provide silicon carbide insulated gate bipolar conduction transistors (IBCTs). The IBCTs include an n-type conductivity silicon carbide substrate and a p-type silicon carbide drift layer on the silicon carbide substrate. An n-type silicon carbide emitter well region is provided in the p-type silicon carbide drift layer and an n-type silicon carbide well region in the p-type silicon carbide drift layer spaced apart from the n-type silicon carbide emitter well region. A space between the n-type silicon carbide emitter well region and the n-type silicon carbide well region defines a JFET region of the IBCT. A p-type silicon carbide emitter region is provided in the well region and a p-type silicon carbide buried channel layer is provided on the emitter well region, the well region and the JFET region.

Although embodiments of the present invention are discussed above with respect to device embodiments, method embodiments are also provided herein.

DETAILED DESCRIPTION OF EMBODIMENTS OF THE INVENTION

Figure 1:
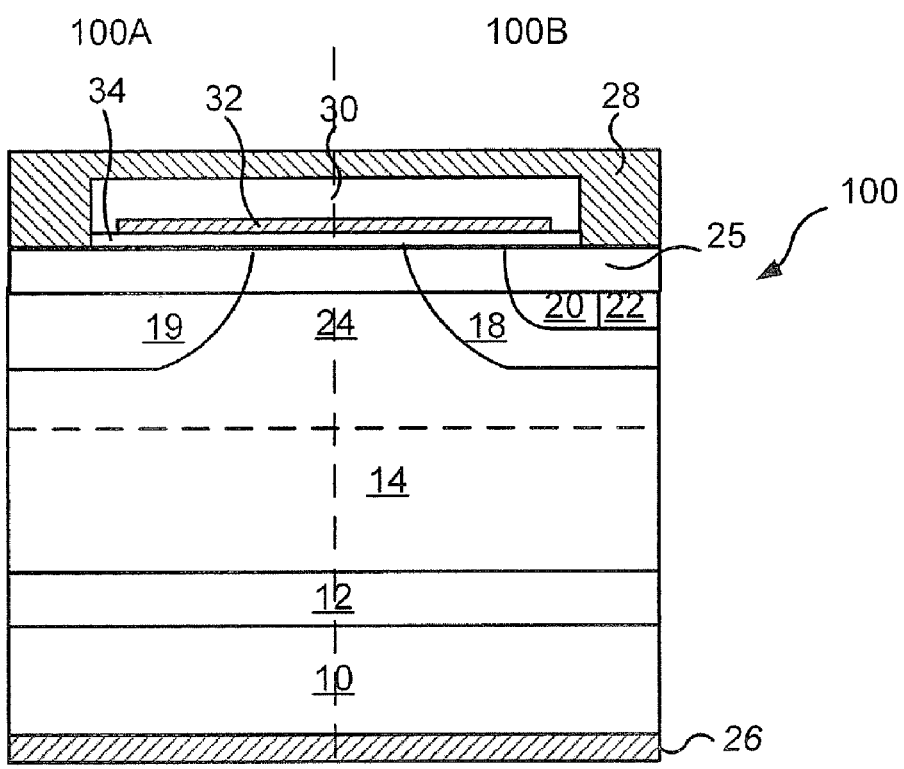
FIG. 1 is a cross-section of an insulated gate bipolar conduction transistor (IBCT) according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in $n^+$, $n^-$, $p^+$, $p^-$, $n^{++}$, $n^{--}$, $p^{++}$, $p^{--}$, or the like), to indicate a relatively larger ("+") or smaller ("−") concentration of majority carriers compared to another layer or region. However, such notation does not imply the existence of a particular concentration of majority or minority carriers in a layer or region.

As will be discussed further herein with respect to FIGS. 1 through 7, some embodiments of the invention provide SiC Insulated gate Bipolar Conduction Transistors (IBCTs) for high power applications and methods of fabricating the same.

IBCTs according to some embodiments of the present invention incorporate elements from both the Bipolar Junction Transistor (BJT) structure and the Insulated Gate Bipolar Transistor (IGBT) structure. It will be understood that in some embodiments of the present invention, the emitter well region of the BJT portion can be electrically shorted to the emitter contact or floating without departing from the scope of the present invention. Provision of a metal oxide semiconductor (MOS) channel on a BJT portion of the IBCT as discussed herein may provide a voltage driven device which may require a less complicated gate driver and a lower power loss. Furthermore, the provision of an epitaxial buried channel as discussed herein may provide eliminate surface roughness caused by previous ion implantation processes. The buried channel may be grown after a high temperature anneal for activation of implants, thus providing IBCTs having improved MOS interfaces as will be discussed herein.

Some embodiments of the present invention will now be discussed with respect to FIGS. 1 through 7. Referring first to FIG. 1, a unit cell 100 of an IBCT structure according to some embodiments of the present invention will be discussed. According to some embodiments of the present invention IBCTs having the structure 100 of FIG. 1 may exhibit current saturation at device operation conditions and a reduced positive temperature coefficient of on-resistance. In some embodiments of the present invention, a negative temperature coefficient may be achieved.

As a preliminary note, the cross-section of the device 100 in FIG. 1 contains two halves. The first half 100A of the device 100 has a structure similar to a conventional BJT but has a metal semiconductor oxide (MOS) channel therein. The second half 100B of the device 100 has a structure similar to a conventional IGBT.

Referring again to FIG. 1, the device 10 of FIG. 1 includes a SiC semiconductor substrate 10. In some embodiments of the present invention, the substrate 10 is an n-type 4H SiC off-axis semiconductor substrate, for example, 8.0 degrees off-axis. The substrate 10 may be highly conductive and have a thickness of from about 200 to about 300 µm. A p-type buffer layer 12 and a p⁻ drift epitaxial layer 14 may be provided on the substrate 10. The p-type buffer layer 12 may have a thickness of from about 1.0 to about 2.0 µm and a doping concentration of about $1 \times 10^{17}$ cm$^{-3}$. In some embodiments of the present invention, the p-type buffer layer 12 may be provided as a channel (field) stop layer to reduce the likelihood or possibly prevent punch-through. The p⁻ drift layer 14 may have a thickness of from about 100 to about 120 µm and a doping concentration of about $2.0 \times 10^{14}$ cm$^{-3}$ to about $6.0 \times 10^{14}$ cm$^{-3}$ to provide a blocking capability of about 10 kV.

As further illustrated in FIG. 1, the device 100 may further include an optional p-type top conductive layer 24 on the p⁻ drift layer 14. The dotted lines indicate the optional nature of the p-type top conductive layer. The p-type top conductive layer 24 may have a thickness of about 1.0 µm and a doping concentration of about $1.0 \times 10^{16}$ cm$^{-3}$. The presence of this p-type top conductive layer 24 may reduce or possibly eliminate JFET effects and may achieve a high carrier lifetime. As discussed above, the p-type top conductive layer 24 is optional. A cross-section of IBCTs not including the optional p-type top conductive layer 24 is illustrated FIG. 6.

Figure 7:
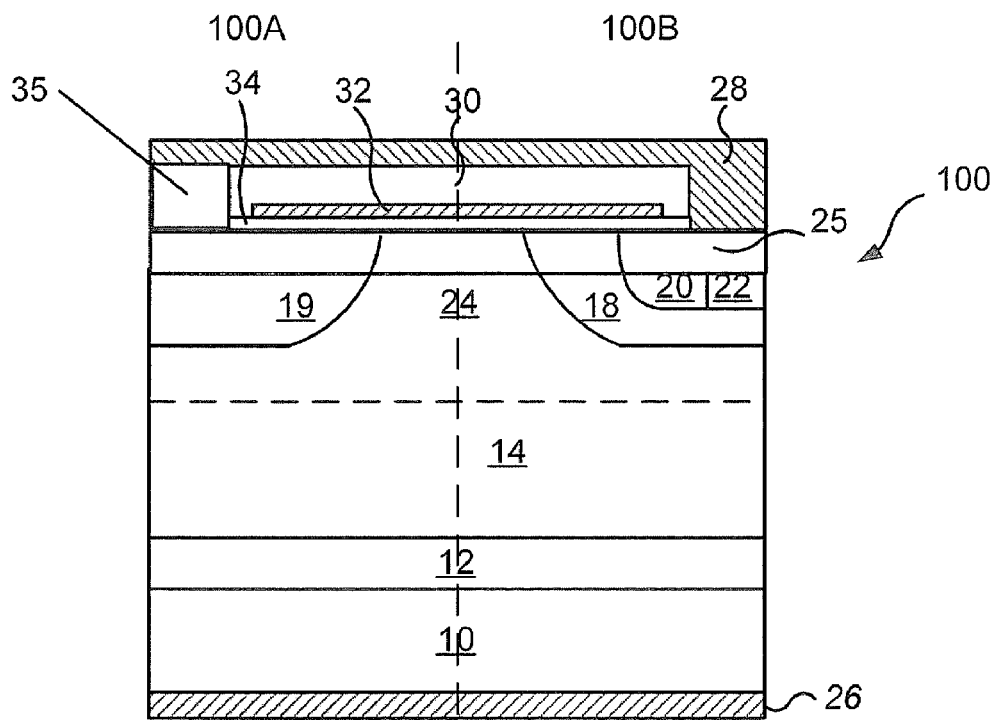
FIG. 7 is a cross-section of an insulated gate bipolar conduction transistor (IBCT) having a floating emitter region according to some embodiments of the present invention.

As further illustrated in FIG. 1, an n-type emitter well region 19 and an n-well region 18 are provided in the p-type top conductive layer 24. As discussed above, in some embodiments of the present invention, the emitter well region 19 of the BJT portion can be electrically shorted to the emitter contact 28 as illustrated in FIG. 1. However, in some embodiments of the present invention, the emitter well region 19 of the BJT portion can be floating as illustrated in FIG. 7 without departing from the scope of the present invention. In particular, as illustrated in FIG. 7, an oxide region 35 may be provided between the emitter well region 19 and the emitter contact 28.

Figure 6:
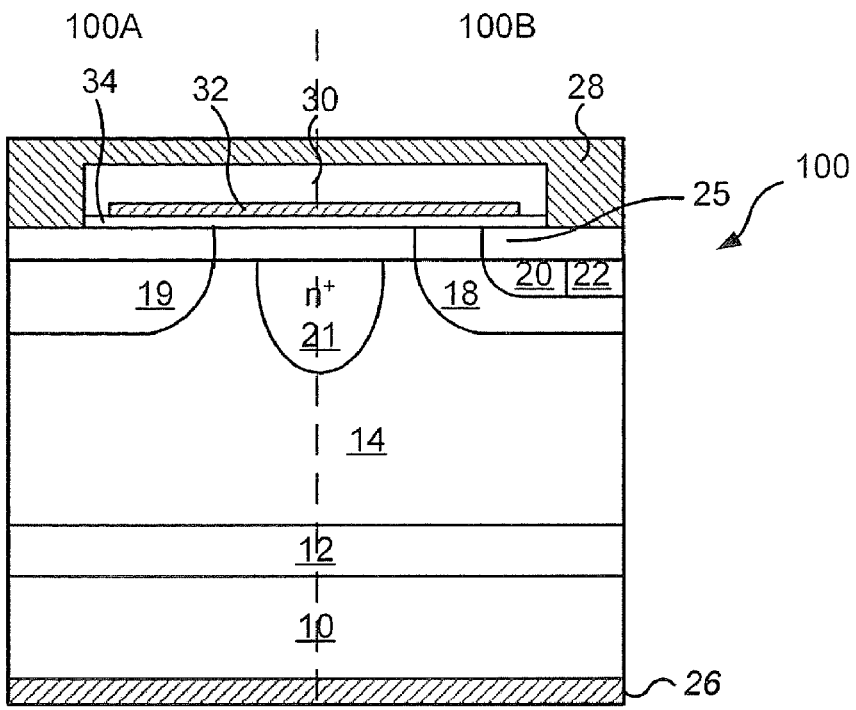
FIG. 6 is a cross-section of an insulated gate bipolar conduction transistor (IBCT) including an additional $n^+$ region in the JFET area according to some embodiments of the present invention.

In embodiments of the present invention where the p-type top conductive layer 24 is not present, for example, embodiments of the present invention illustrated in FIG. 6, the n-type emitter well region 19 and the n-well region 18 are provided in the p⁻ drift layer 14. A p⁺ emitter region 20 is also provided in the n-well region 18. As further illustrated, the device 100 further includes an n⁺ contact region 22 in the well region 18. The n⁺ contact region 22 may have a doping concentration of about $1 \times 10^{18}$ cm$^{-3}$. A guard-ring based termination (not shown) may be provided around the device periphery in some embodiments of the present invention.

As further illustrated in FIG. 1, a buried MOS channel 25 may be provided on the surface of the device and in the MOS channel region of the device 100. The buried MOS channel may be p-type SiC, have a doping concentration of about $1 \times 10^{17}$ and have a thickness of about 3000 Å. The formation and/or presence of the buried channel layer 25 may eliminate surface roughness caused by ion implantation and may exhibit less crystal defects because an activation anneal may before performed before formation thereof as will be discussed further below. A field oxide 30 including, for example, silicon dioxide is provided on the buried MOS channel 25 such that it exposes an active region of the device. The field oxide 30 may have a thickness of about 1.0 µm. A gate oxide layer 34 may also be provided on the device and such that a final gate oxide thickness is from about 400 to about 600 Å.

A polysilicon gate 32 may be provided on the resulting device as illustrated in FIG. 1. Ohmic contacts 28 and 26 may provide an emitter contact metal and a collector contact metal, respectively. In some embodiments of the present invention, the emitter contact metal 28 may include aluminum and nickel (Al/Ni) and the collector contact metal 26 may include Ni.

Accordingly, as discussed above, some embodiments of the present invention provide IBCTs, which combine elements of IGBTs and BJTs. IBCTs according to some embodiments of the present invention include a MOS channel on the IGBT side to provide base current, which may allow current saturation unlike conventional IGBT devices for use in current sensitive devices. Furthermore, devices according to embodiments of the present invention are voltage driven devices and, therefore, may have a relatively less complicated driver and much lower power loss, i.e., as the voltage increases, the current saturates. Furthermore, the JFET region according to some embodiments of the present invention may be wider, for example, from about 5.0 to about 10.0 µm wider, than in conventional devices, thereby enhancing current conduction and increasing the electric field.

Figure 2A:
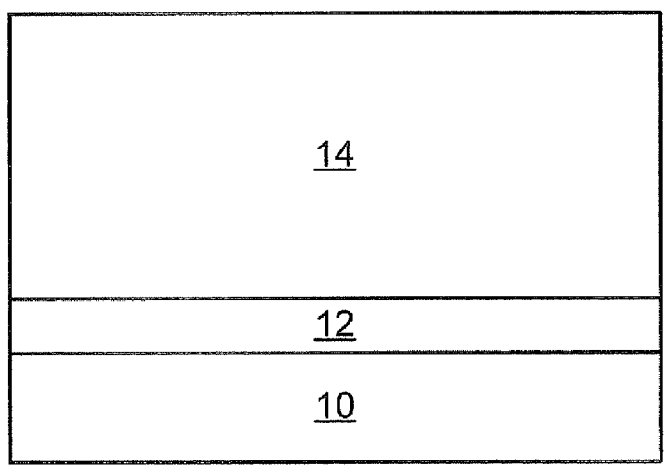
FIGS. 2A through 2D are cross-sections illustrating processing steps in the fabrication of IBCTs according to some embodiments of the present invention.

Referring now to FIGS. 2A through 2D, processing steps in the fabrication of IBCTs according to some embodiments of the present invention will be discussed. Referring first to FIG. 2A, a p-type buffer layer 12 and a p⁻ drift epitaxial layer 14 are formed on a SiC semiconductor substrate 10. In some embodiments of the present invention, the substrate 10 is an n-type 4H SiC off-axis semiconductor substrate, for example, 8.0 degrees off-axis. The substrate 10 may be highly conductive and have a thickness of from about 200 to about 300 µm. The p-type buffer layer 12 may have a thickness of from about 1.0 to about 2.0 µm and a doping concentration of about $1 \times 10^{17}$ cm$^{-3}$. In some embodiments of the present invention, the p-type buffer layer 12 may be provided as a channel (field) stop layer to reduce the likelihood or possibly prevent punch-through. The p⁻ drift layer 14 may have a thickness of from about 100 to about 120 μm, and may be doped with p-type dopants at a doping concentration of about $2.0 \times 10^{14}$ cm$^{-3}$ to about $6.0 \times 10^{14}$ cm$^{-3}$ for a blocking capability of about 10 kV.

Figure 2B:
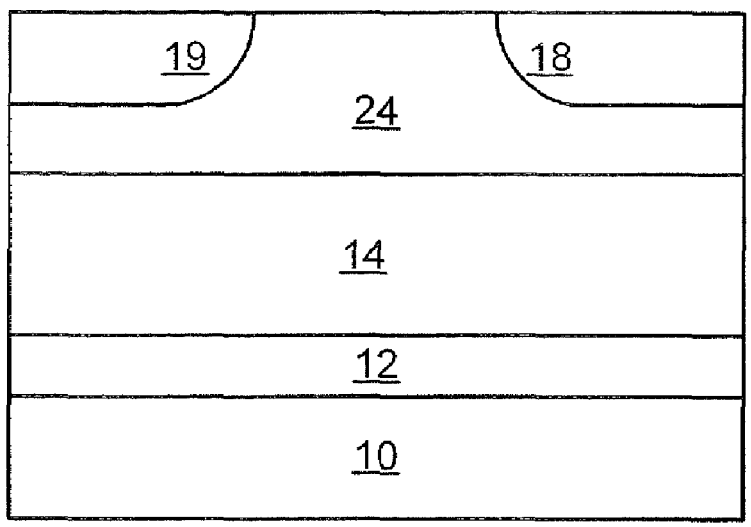

Referring now to FIG. 2B, an optional p-type top conductive layer 24 may be formed on the p⁻ drift layer 14. The p-type top conductive layer 24 may have a thickness of about 1.0 μm and a doping concentration of about $1.0 \times 10^{16}$ cm$^{-3}$. The presence of this p-type top conductive layer 24 may reduce or possibly eliminate JFET effects and may achieve a high carrier lifetime. Embodiments of the present invention omitting the formation of the p-type top conductive layer are illustrated in the cross-section of IBCTs according to some embodiments of the present invention illustrated in FIG. 6.

The p-type top conductive layer 24 may be formed, for example, by implantation of aluminum, in the p⁻ drift layer 14. The p-type top conductive layer may be implanted with p-type dopants to reduce the JFET resistance from the adjacent n-type well regions. In particular, the JFET implantation dose may be selected to reduce the JFET resistance while keeping implant damage at an acceptable level. In some embodiments, implantation may be performed at a dose sufficient to provide a dopant concentration of about $1.0 \times 10^{16}$ cm$^{-3}$ in the JFET region. In some embodiments of the present invention, the p-type top conductive layer 24 may be formed by an epitaxial growth process, which may achieve a high carrier lifetime. Implanted and epitaxial top conductive layers are discussed in detail in commonly assigned, copending U.S. patent application Ser. No. 11/711,383 to Zhang, filed Feb. 27, 2007 entitled *Insulated Gate Bipolar Transistors Including Current Suppressing Layers*, the disclosure of which is hereby incorporated herein by reference as if set forth in its entirety. Thus, further details with respect to the p-type top conductive layer will not be discussed further herein.

Referring still to FIG. 2B, an n-type emitter well region 19 and an n-well region 18 are formed in the p⁻ drift layer or the p-type top conductive layer 24, if present. The emitter well region 19 and well region 18 may be formed using ion implantation or eptiaxial growth. The n-type regions may be implanted selectively using nitrogen. In embodiments of the present invention using epitaxial growth, the n- or p-type wells and emitter wells formed by epitaxial growth may have reduced crystal damages and achieve a high hole carrier concentration. Furthermore, according to some embodiments of the present invention, n- or p-type top emitter wells can be localized to further improve an on-resistance of the IBCTs by providing more current conduction paths in JFET region. The cell can be linear, but may also have other shapes.

Figure 2C:
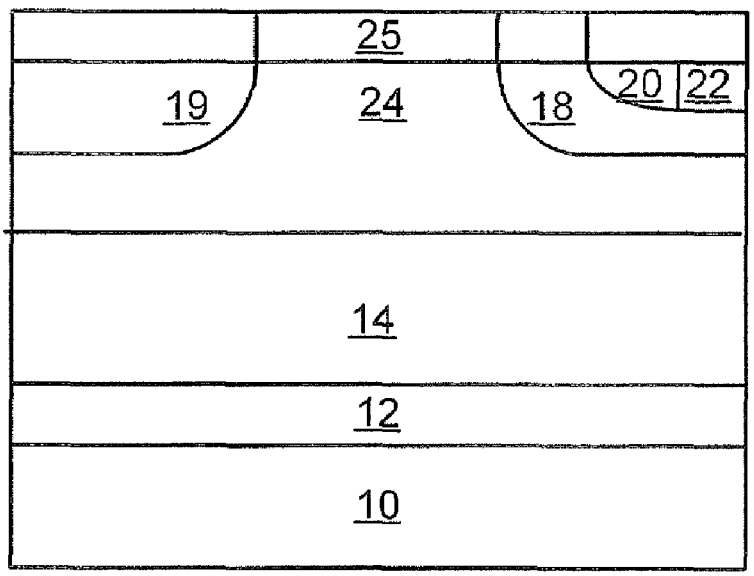

Referring now to FIG. 2C, a p⁺ emitter region 20 is formed in the n-well region 18. The p-type regions may be implanted selectively using aluminum. In some embodiments of the present invention, the p⁺ emitter region 20 may be epitaxially grown without departing from the scope of the present invention. An n⁺ contact region 22 having a doping concentration of about $1 \times 10^{18}$ cm$^{-3}$ may be formed in the well region 18 adjacent the p⁺ emitter region 20. The n⁺ contact region 22 may be implanted or epitaxially grown without departing from the scope of the present invention. All of the implants may be annealed at a temperature of from about 1650 to about 1850° C.

As further illustrated in FIG. 2C, a buried MOS channel 25 may be provided on the surface of the device. The buried MOS channel 25 may be p-type SiC, have a doping concentration of about $1 \times 10^{17}$ and have a thickness of about 3000 Å. The formation and/or presence of the buried channel layer 25 may eliminate surface roughness caused by ion implantation and may exhibit less crystal defects because an activation anneal may be performed before formation thereof as will be discussed further below.

The buried channel layer 25 may be formed using ion implantation and/or epitaxial regrowth techniques. For example, after the activation anneal discussed above, a buried channel layer 25 may be grown by epitaxial regrowth. In these embodiments of the present invention, the buried channel 25 may also permit formation of a deep n-well that may prevent latch-up by lifting the p-type emitter implants to the buried channel regrowth layer. The deep n-well may cause a lower n-well resistance and may increase the device latch-up current. In further embodiments of the present invention, the buried channel may be formed by ion implantation. The buried channel may also be formed by p-type epitaxial growth, which may provide a high channel mobility and/or a long carrier lifetime.

As discussed above, all of the implanted dopants may be activated by annealing the structure at a temperature of from about 1650 to about 1850° C. with a silicon over pressure and/or covered by an encapsulation layer such as a graphite film. A high temperature anneal may damage the surface of the silicon carbide epitaxy. In some embodiments of the present invention, in order to reduce such damage, a graphite coating may be formed on the surface of the device. Prior to annealing the device to activate the implanted ions, a graphite coating may be applied to the top/front side of the structure in order to protect the surface of the structure during the anneal. The graphite coating may be applied by a conventional resist coating method and may have a thickness of about 1.0 μm. The graphite coating may be heated to form a crystalline coating on the p⁻ drift layer 14. The implanted ions may be activated by a thermal anneal that may be performed, for example, in an inert gas at a temperature of about 1600° C. or greater. In particular the thermal anneal may be performed at a temperature of about 1600° C. in argon for about 5 minutes. The graphite coating may help to protect the surface of the drift layer 14 during the high temperature anneal.

Figure 2D:
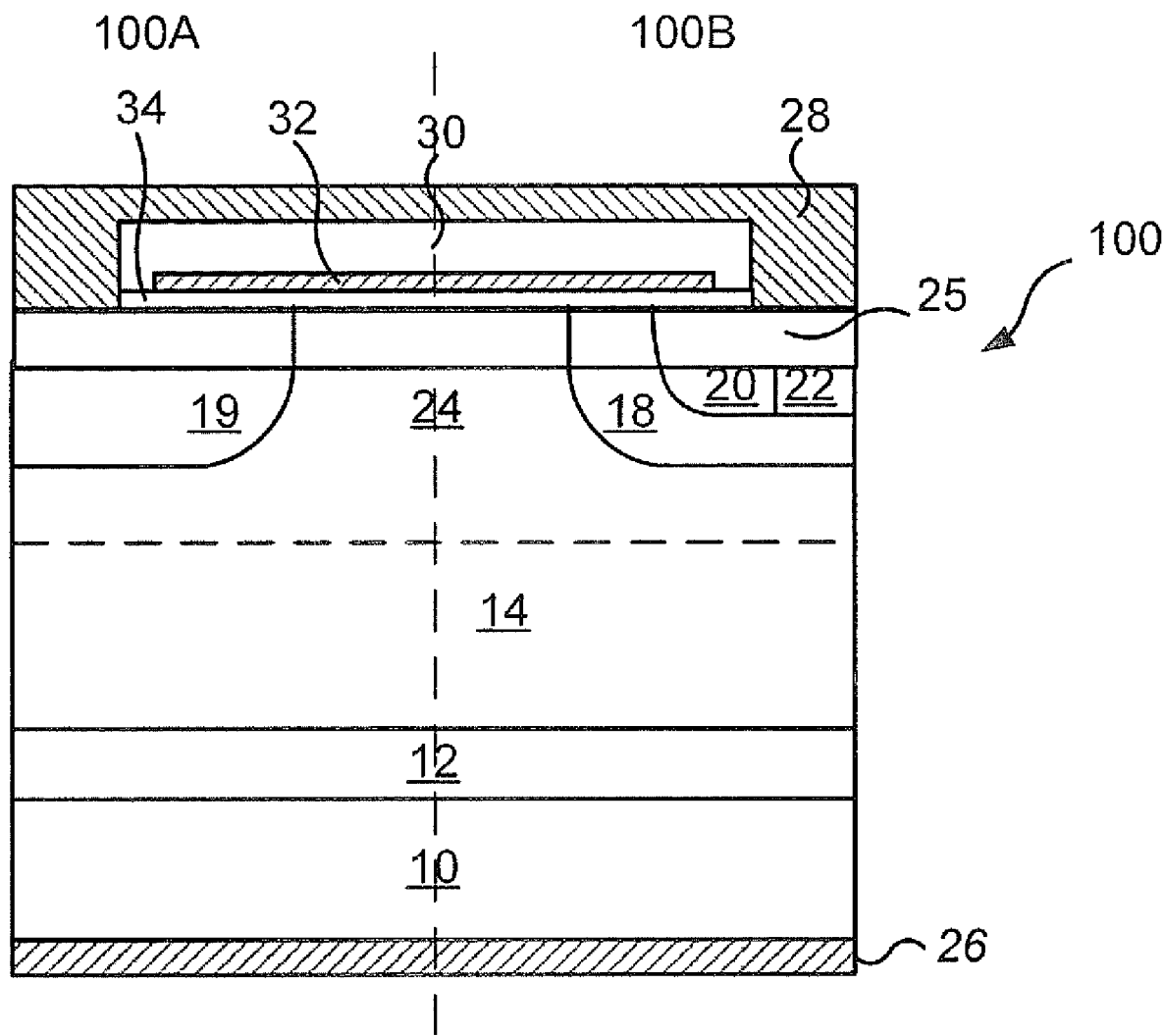

Referring now to FIG. 2D, the graphite coating may then be removed, for example, by ashing and thermal oxidation. After implant annealing, a field oxide 30 of silicon dioxide having a thickness of about 1.0 μm is deposited and patterned to expose the active region of the device. A gate oxide layer 34 may be formed by a gate oxidation process, with a final gate oxide thickness of from about 400 to about 600 Å.

In particular, the gate oxide may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, "anneal of oxide in wet $O_2$" refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1175° C. in dry $O_2$ for about 3.5 hours. The resulting oxide layer may be annealed at a temperature of tip to about 1200° C. in an inert atmosphere. In particular, the resulting oxide layer may be annealed at a temperature of about 1175° C. in Ar for about 1 hour. The wet O$_2$ oxide anneal may be performed at a temperature of about 950° C. or less for a time of at least about 1 hour. The temperature of the wet O$_2$ anneal may be limited to discourage further thermal oxide growth at the SiC/SiO$_2$ interface, which may introduce additional interface states. In particular, the wet O$_2$ anneal may be performed in wet O$_2$ at a temperature of about 950° C. for about 3 hours. The resulting gate oxide layer may have a thickness of about 500 Å.

Referring again to FIG. 2D, after formation of the gate oxide 34, a polysilicon gate 32 may be deposited and doped, for example, with boron followed by a metallization process to reduce the gate resistance. Al/Ni contacts may be deposited as the p-type ohmic emitter contact metal 28, and Ni as the n-type collector contact metal 26. All contacts may be sintered in a Rapid Thermal Annealer (RTA), and thick Ti/Au layers may be used for pad metals.

Thus, according to some embodiments of the present invention, high channel mobility may be achieved by using buried channel epitaxial regrowth with the same polarity as the drift layer, or activating channel implants at high temperature with or without an encapsulation layer such as graphite film as discussed herein. Furthermore, n- or p-type wells and emitter wells can be formed by epitaxial growth instead of ion implantation to reduce the crystal damages from ion implantation and achieve a high hole carrier concentration. The n- or p-type top emitter wells may also be localized to further improve the IBCT's on-resistance by providing more current conduction paths in JFET region; the cell could be linear and other shapes.

Referring now to FIGS. 3A and 3B, layout diagrams illustrating (A) continuous and (B) local emitter wells for IBCTs according to some embodiments of the present invention will be discussed. Referring first to FIG. 3A, a 50/50 ratio layout for IBCTs according to some embodiments of the present invention is illustrated, i.e. half of the die (310) corresponds to the BJT portion 100A of the IBCT and half the die (320) correspond to the IGBT portion 100B of the IBCT.

FIG. 3B illustrates a local emitter well die layout for IBCTs according to some embodiments of the present invention. In particular, each block 330 on the die includes both a BJT portion and an IGBT portion of the IBCT according to some embodiments of the present invention. In particular, the p$^+$ 360 regions surround the n$^+$ 350 regions of the IGBT portion 100B in the center of the block as illustrated in FIG. 3B. Furthermore, the BJT portion 340 is provided at the corners of the block 330. In embodiments of the present invention illustrated in FIG. 3B, an additional n$^+$ region 21 may be used to control current depletion in the JFET area as illustrated in the cross-section of FIG. 6.

Figure 3:
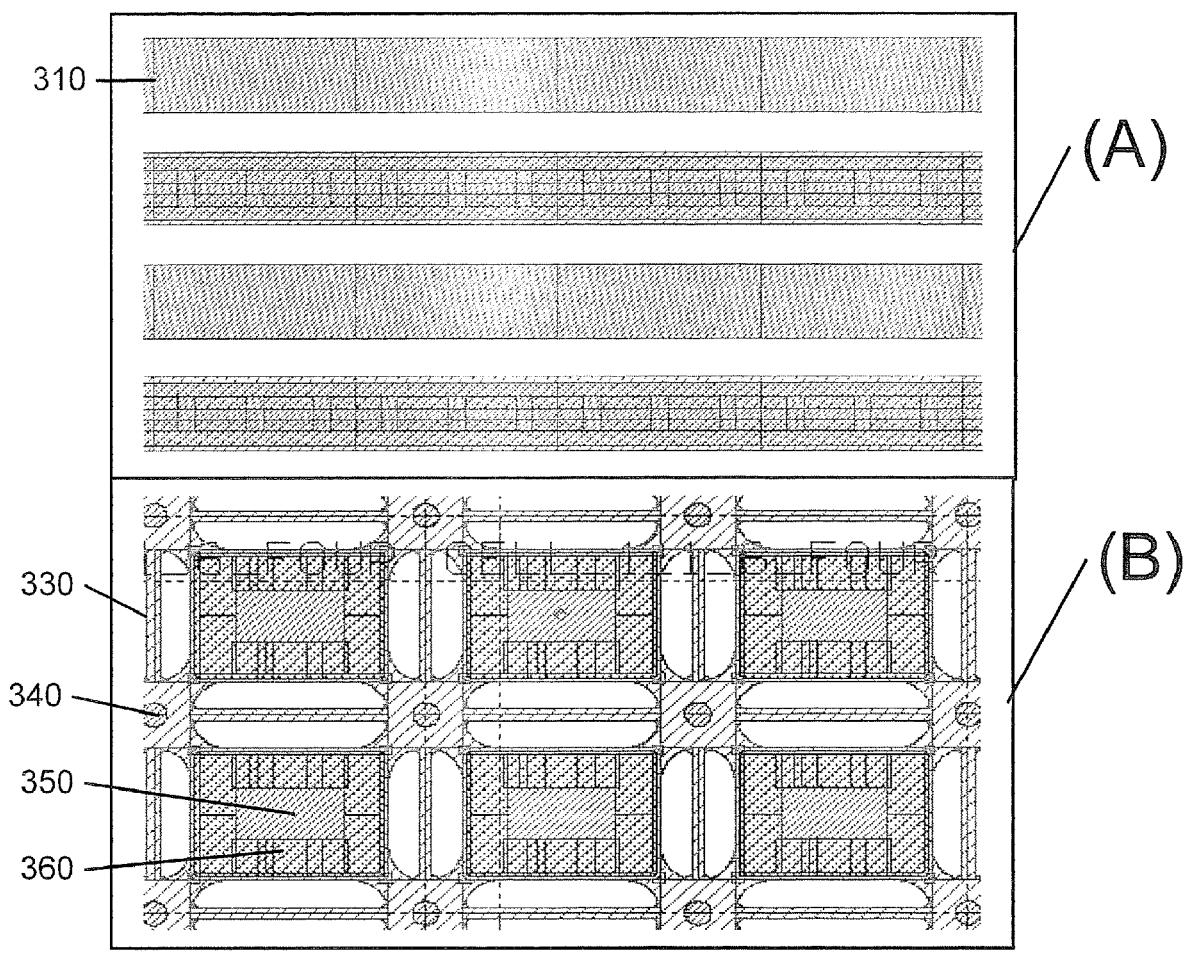
FIGS. 3A and 3B are layout diagrams illustrating (A) continuous and (B) local emitter wells for IBCTs according to some embodiments of the present invention.

Referring now to FIGS. 1 and 3A-5, example simulation results for IBCTs according to some embodiments of the present invention will be discussed. A p-channel IBCT was fabricated in accordance with some embodiments of the present invention. A cross-section and die layout of the planar IBCT structure used for the simulation is illustrated in FIGS. 3A and 3B. A p-type buffer layer 12 and drift epilayer 14 were grown on an n-type, off-axis 4H—SiC substrate. The p-type buffer layer 12 had a doping concentration of about $1.0 \times 10^{17}$ cm$^{-3}$ to reduce the likelihood or possibly prevent punch through. The p$^-$ drift layer 14 was selected based on the blocking rating. For example, the p$^-$ drift layer 14 had a thickness of about 100 µm and a doping concentration of from about $2.0 \times 10^{14}$ to about $6.0 \times 10^{14}$ cm$^{-3}$, which provided 10 kV blocking capability. A P-type top conductive layer 24 having a thickness of 1.0 µm thick and a doping concentration of about $1.0 \times 10^{16}$ cm$^{-3}$ was formed on the p$^-$ drift layer 14 to reduce or possibly eliminate JFET effects and achieve a high carrier lifetime.

The n-well 18, n-emitter of BJT portion 19, and p$^+$ emitter regions 20 were implanted selectively with Nitrogen and Aluminum. A p-type buried channel 25 concept was used to modify the threshold voltage and improve the inversion channel mobility. It will be understood that the buried channel 25 can formed as an as-grown material or by additional layer regrowth without departing from the scope of the present invention. In embodiments of the present invention using regrowth to form the buried channel 25, after high temperature implantation activation, a buried channel was grown. All implants were activated at high temperature with silicon over pressure or covered by an encapsulation layer, such as a graphite film. A layer of SiO$_2$ have a thickness of about 1.0 µm was deposited on the device as the field oxide 30. A MOS oxide 34 was thermally grown on the device and had a thickness of from about 400 to about 600 Å. Subsequently, a polysilicon gate 32 was deposited and doped with Boron. Al/Ni was used as p-type ohmic contact 28 (emitter contact), and Ni as the n-type contact metal 26 (collector contact). All contacts were annealed using RTA, and thick Ti/Au layers were used for overlayer metals. The demonstrated IBCT has an active area of about 0.4 mm$^2$.

Figure 4:
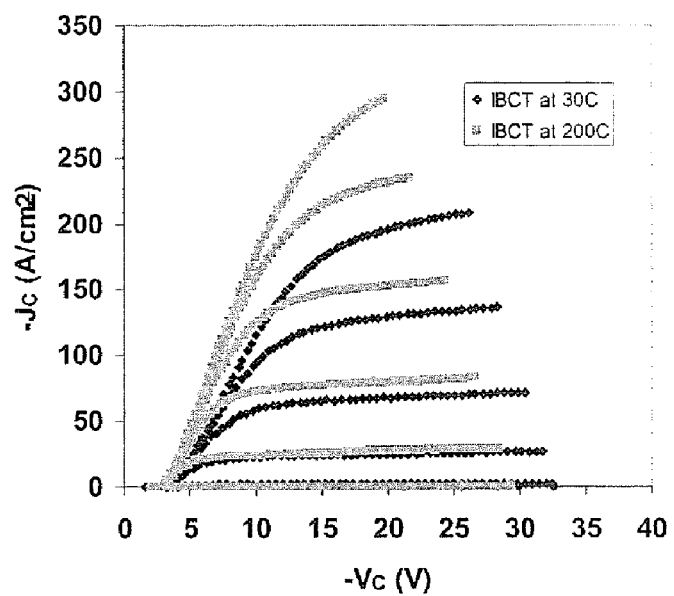
FIG. 4 is a graph of on-state J-V characteristics for IBCT devices according to some embodiments of the invention.

IBCTs according to some embodiments of the present invention fabricated as discussed above, demonstrated a blocking voltage of 8.0 kV with a leakage current of less than about 0.1 mA/cm$^2$. A differential on-resistance of 50 mΩ·cm$^2$ at the gate bias of −16V was achieved at 25° C., and decreased to ~38 mΩ·cm$^2$ at 200° C. as shown in FIG. 4, which illustrates a graph of on-state J-V characteristics for IBCT devices according to some embodiments of the invention.

Figure 5:
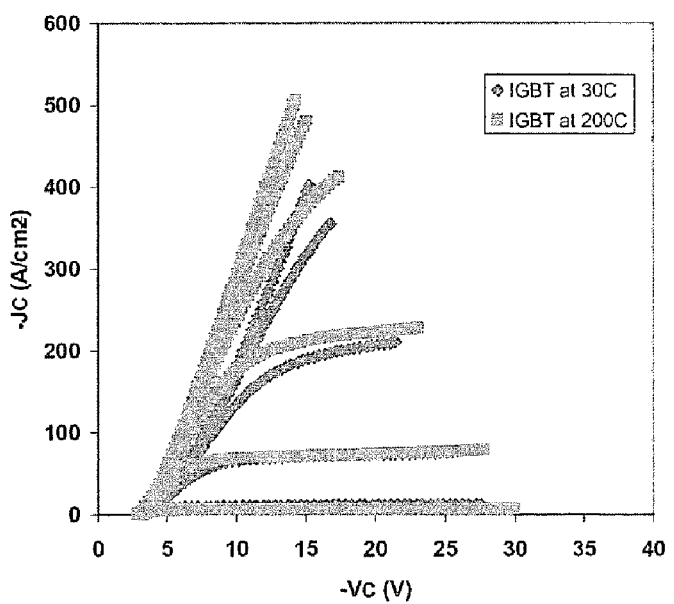
FIG. 5 is a graph of on-state J-V characteristics for conventional insulates gate bipolar transistors (IGBTs) according to some embodiments of the invention.

For comparison, the on-state characteristics of an IGBT fabricated in conjunction with IBCTs are illustrated in FIG. 5. A differential on-resistance of 39 mΩ·cm$^2$ at the gate bias of −16V was achieved at 25° C., and decreased to ~23 mΩ·cm$^2$ at 200° C. At a gate bias of −16 V, the conduction current of IGBTs keeps exponentially increasing with the collector voltage, while a clear current saturation can be observed in IBCTs.

It will be appreciated that although some embodiments of the invention have been described in connection with silicon carbide IBCT devices having n-type substrates and p-type drift layers, and in which the minority carriers injected into the drift layer include electrons, the present invention is not limited thereto, and may be embodied in devices having p-type substrates and/or n-type drift layers.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An insulated gate bipolar conduction transistor (IBCT), comprising:
   a drift layer having a first conductivity type;
   an emitter well region in the drift layer and having a second conductivity type opposite the first conductivity type;
   a well region in the drift layer and having the second conductivity type, wherein the well region is spaced apart from the emitter well region and wherein a space between the emitter well region and the well region defines a JFET region of the IBCT;
   an emitter region in the well region and having the first conductivity type; and a buried channel layer on the emitter well region, the well region and the JFET region and the buried channel layer having the first conductivity type.

2. The IBCT of claim 1, wherein the buried channel layer comprises an epitaxial layer.

3. The IBCT of claim 2, wherein the buried channel layer has a thickness of from about 1000 to about 3000 Å.

4. The IBCT of claim 2, wherein the buried channel layer has a doping concentration of from about $5\times10^{15}$ to about $1\times10^{17}$ cm$^{-3}$.

5. The IBCT of claim 2, further comprising a substrate having the second conductivity type, wherein the drift layer is provided on the substrate;
wherein the substrate comprises an off-axis n-type silicon carbide substrate; and
wherein the drift layer and the buried channel layer comprise p-type silicon carbide epitaxial layers.

6. The IBCT of claim 1, wherein the drift layer has a doping concentration of from about $2\times10^{14}$ cm$^{-3}$ to about $6\times10^{14}$ cm$^{-3}$ and a thickness of from about 100 μm to about 120 μm for greater than 10 kV applications.

7. The IBCT of claim 1, wherein the IBCT has a blocking voltage of about 8.0 kV and a leakage current of less than about 0.1 mA/cm$^2$.

8. The IBCT of claim 1, wherein the first conductivity type comprises n-type and the second conductivity type comprises p-type.

9. The IBCT of claim 1, wherein the first conductivity type comprises p-type and the second conductivity type comprises n-type.

10. The IBCT of claim 1, further comprising:
a substrate having the second conductivity type, wherein the drift layer is provided on the substrate; and
a buffer layer between the substrate and the drift layer, wherein the buffer layer has the first conductivity type.

11. The IBCT of claim 1, further comprising an integrated circuit substrate, wherein the drift region is provided on the integrated circuit substrate and wherein the buried channel layer is provided on a surface of the drift region opposite the integrated circuit substrate.

12. The IBCT of claim 1, further comprising a contact region in the well region, the contact region being adjacent the emitter region and having the second conductivity type.

13. The device of claim 12, wherein the contact region has a doping concentration of about $1\times10^{18}$ cm$^{-3}$.

14. An insulated gate bipolar conduction transistor (IBCT), comprising:
a drift layer having a first conductivity type;
an emitter well region in the drift layer and having a second conductivity type opposite the first conductivity type;
a well region in the drift layer and having the second conductivity type, wherein the well region is spaced apart from the emitter well region and wherein a space between the emitter well region and the well region defines a JFET region of the IBCT;
an emitter region in the well region and having the first conductivity type; and
a buried channel layer on the emitter well region, the well region and the JFET region, the buried channel layer having the first conductivity type, wherein the IBCT has a differential on-resistance of 50 mΩ·cm$^2$ at a gate bias of −16V at 25° C.

15. A method of forming an insulated gate bipolar conduction transistor (IBCT), comprising:
providing a drift layer having a first conductivity type;
providing an emitter well region in the drift layer and having a second conductivity type opposite the first conductivity type;
providing a well region in the drift layer and having the second conductivity type, wherein the well region is spaced apart from the emitter well region and wherein a space between the emitter well region and the well region defines a JFET region of the IBCT;
providing an emitter region in the well region and having the first conductivity type; and
providing a buried channel layer on the emitter well region, the well region and the JFET region and the buried channel layer having the first conductivity type.

16. The method of claim 15:
wherein providing the emitter well region comprises providing the emitter well region using epitaxial growth; and
wherein providing the well region comprises providing the well region using epitaxial growth.

17. The method of claim 15, wherein providing the buried channel layer comprises providing the buried channel layer using epitaxial regrowth with a same polarity as the drift layer.

18. The method of claim 17, wherein providing the buried channel layer comprises providing a buried channel layer having a thickness of from about 1000 to about 3000 Å.

19. The method of claim 17, wherein providing the buried channel layer comprises providing the buried channel layer having a doping concentration of from about $5\times10^{15}$ about $1\times10^{17}$ cm$^{-3}$.

20. The method of claim 15, further comprising providing an off-axis n-type silicon carbide substrate,
wherein providing the drift layer comprises providing a p-type silicon carbide epitaxial drift layer; and
wherein providing the buried channel layer comprises providing a p-type silicon carbide epitaxial channel layer.

21. The method of claim 15, wherein providing the drift layer comprises providing the drift layer having a doping concentration of from about $2\times10^{14}$ cm$^{-3}$ to about $6\times10^{14}$ cm$^{-3}$ and a thickness of from about 100 μm to about 120 μm.

22. The method of claim 15, wherein the IBCT has a blocking voltage of about 8.0 kV and a leakage current of less than about 0.1 mA/cm$^2$.

23. The method of claim 15, wherein the first conductivity type comprises n-type and the second conductivity type comprises p-type.

24. The method of claim 15, wherein the first conductivity type comprises p-type and the second conductivity type comprises n-type.

25. The method of claim 15, further comprising:
providing a substrate, wherein providing the drift layer comprises providing the drift layer on the substrate; and
providing a buffer layer between the substrate and the drift layer, wherein the buffer layer has the first conductivity type.

26. A method of forming an insulated gate bipolar conduction transistor (IBCT), comprising:
providing a drift layer having a first conductivity type;
providing an emitter well region in the drift layer and having a second conductivity type opposite the first conductivity type;
providing a well region in the drift layer and having the second conductivity type, wherein the well region is spaced apart from the emitter well region and wherein a space between the emitter well region and the well region defines a JFET region of the IBCT;

providing an emitter region in the well region and having the first conductivity type; and providing a buried channel layer on the emitter well region, the well region and the JFET region and having the first conductivity type, wherein the IBCT has a differential on-resistance of 50 mΩ·cm² at a gate bias of −16V at 25° C.

27. A silicon carbide insulated gate bipolar conduction transistor (IBCT), comprising:

an n-type conductivity silicon carbide substrate;

a p-type silicon carbide drift layer on the silicon carbide substrate;

an n-type silicon carbide emitter well region in the p-type silicon carbide drift layer;

an n-type silicon carbide well region in the p-type silicon carbide drift layer, wherein the n-type silicon carbide well region is spaced apart from the n-type silicon carbide emitter well region and wherein a space between the n-type silicon carbide emitter well region and the n-type silicon carbide well region defines a JFET region of the IBCT;

a p-type silicon carbide emitter region in the well region; and a p-type silicon carbide buried channel layer on the emitter well region, the well region and the JFET region.

28. An insulated gate bipolar conduction transistor (IBCT), comprising:

a semiconductor layer having a first conductivity type;

an emitter well region in the semiconductor layer and having a second conductivity type opposite the first conductivity type;

a well region in the semiconductor layer and having the second conductivity type, wherein the well region is spaced apart from the emitter well region;

an emitter region in the well region and having the first conductivity type; and a contact region in the well region, the contact region being adjacent the emitter region and having the second conductivity type.

* * * * *